(12) United States Patent
Fujimori et al.

(10) Patent No.: US 10,389,063 B2
(45) Date of Patent: Aug. 20, 2019

(54) SYSTEM AND CONNECTOR

(71) Applicant: FANUC CORPORATION, Yamanashi (JP)

(72) Inventors: Toshihiro Fujimori, Yamanashi-ken (JP); Shuntaro Toda, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/966,582

(22) Filed: Apr. 30, 2018

(65) Prior Publication Data

US 2018/0316127 A1 Nov. 1, 2018

(30) Foreign Application Priority Data

May 1, 2017 (JP) ................... 2017-090977

(51) Int. Cl.
*G06F 1/3206* (2019.01)
*H01R 13/629* (2006.01)
*B25J 9/16* (2006.01)
*G11C 7/00* (2006.01)
*H01R 13/625* (2006.01)
*H01R 13/70* (2006.01)
(Continued)

(52) U.S. Cl.
CPC .......... *H01R 13/629* (2013.01); *B25J 9/1602* (2013.01); *G11C 7/00* (2013.01); *H01R 13/625* (2013.01); *H01R 13/701* (2013.01); *G05B 2219/39549* (2013.01); *H01R 24/68* (2013.01); *H01R 2107/00* (2013.01)

(58) Field of Classification Search
None
See application file for complete search history.

(56) References Cited

U.S. PATENT DOCUMENTS 5,621,899 A * 4/1997 Gafford ................... G06F 13/36
710/119
2004/0239183 A1* 12/2004 Delgado ................ B60N 2/002
307/10.1
(Continued)

FOREIGN PATENT DOCUMENTS

JP 61127032 A 6/1986
JP 63276885 A 11/1988
(Continued)

OTHER PUBLICATIONS

English Abstract and Machine Translation for Japanese Publication No. JPH11-884 A, published Jan. 6, 1999, 19 pgs.
(Continued)

*Primary Examiner* — Hyun Nam
(74) *Attorney, Agent, or Firm* — Fredrikson & Byron, P.A.

(57) ABSTRACT

A system includes: a connector including a first connector part connected to a first device and a second connector part being attachable and detachable with respect to the first connector part and being connected to a second device; and a detachment switch provided for the connector and operated when the second connector part is disconnected from the first connector part. The first device is configured to be triggered to perform a predetermined process when the detachment switch is operated while the second connector part remains joined to the first connector part.

14 Claims, 4 Drawing Sheets

(51) Int. Cl.
*H01R 24/68* (2011.01)
*H01R 107/00* (2006.01)

(56) References Cited

U.S. PATENT DOCUMENTS

| | | | | |
|---|---|---|---|---|
| 2006/0078093 A1* | 4/2006 | Karam | .................... | H04L 1/22 379/24 |
| 2013/0113415 A1* | 5/2013 | Chen | .................... | B65D 19/385 320/107 |
| 2013/0196525 A1* | 8/2013 | Takamatsu | ........... | B60Q 1/0094 439/232 |
| 2016/0031077 A1* | 2/2016 | Inaba | .................... | B25J 9/0081 700/264 |
| 2016/0334856 A1* | 11/2016 | Yseboodt | ................ | G06F 1/266 |

FOREIGN PATENT DOCUMENTS

| | | | |
|---|---|---|---|
| JP | 1194001 | A | 8/1989 |
| JP | 7296891 | A | 11/1995 |
| JP | 11884 | A | 1/1999 |
| JP | 2002224983 | A | 8/2002 |
| JP | 200343901 | A | 2/2003 |
| JP | 201056161 | A | 3/2010 |
| JP | 2010176873 | A | 8/2010 |
| JP | 201288312 | A | 5/2012 |
| JP | 201630324 | A | 2/2016 |

OTHER PUBLICATIONS

English Abstract and Machine Translation for Japanese Publication No. JPS63-276885 A, published Nov. 15, 1988, 10 pgs.
English Abstract and Machine Translation for Japanese Publication No. 2012-088312 A, published May 10, 2012, 16 pgs.
English Abstract and Machine Translation for Japanese Publication No. 2003-043901 A, published Feb. 14, 2003, 17 pgs.
English Abstract and Machine Translation for Japanese Publication No. 2010-176873 A, published Aug. 12, 2010, 17 pgs.
English Abstract and Machine Translation for Japanese Publication No. JPH07-296891 A, published Nov. 10, 1995, 8 pgs.
English Abstract and Machine Translation for Japanese Publication No. JPH01-194001 A, published Aug. 4, 1989, 6 pgs.
English Abstract and Machine Translation for Japanese Publication No. JPS61-127032 A, published Jun. 14, 1986, 5 pgs.
English Abstract for Japanese Publication No. 2016-030324 A, published Mar. 7, 2016, 2 pgs.
English Abstract and Machine Translation for Japanese Publication No. 2010-056161 A, published Mar. 11, 2010, 12 pgs.
English Abstract and Machine Translation for Japanese Publication No. 2002-224983 A, published Aug. 13, 2002, 34 pgs.

* cited by examiner

SYSTEM AND CONNECTOR

CROSS-REFERENCE TO RELATED APPLICATION

This application is based upon and claims the benefit of priority from Japanese Patent Application No. 2017-090977 filed on May 1, 2017, the contents of which are incorporated herein by reference.

BACKGROUND OF THE INVENTION

Field of the Invention

The present invention relates to a system in which a first device and a second device are connected via a cable and a connector for detachably connecting the first device and the second device.

Description of the Related Art

Japanese Laid-Open Patent Publication No. 2016-030324 discloses a robot control device with a removable operation panel. Briefly, the control device body is provided with a detachment switch. The control device body is configured so as not to cut off the driving power to the robot even if it receives an immediate stop signal which is transmitted from the operation panel by releasing connection between the operation panel and the control device body, in a detachment permissible state from when the detachment switch was operated until a predetermined time elapses.

SUMMARY OF THE INVENTION

However, in Japanese Laid-Open Patent Publication No. 2016-030324, if the operator, as having forgotten to operate the detachment switch, disconnects the control device body (which will be referred to, hereinbelow, as the first device) and the operation panel (which will be referred to, hereinbelow, as the second device), the driving power to the robot is not supplied and the robot stops. Further, since the detachment switch is provided in the first device, the configuration of the first device becomes complicated.

The present invention has been devised in view of the above circumstances. It is therefore an object of the present invention to provide a system and a connector that prevent the operator from forgetting to operate a detachment switch when releasing connection between first and second devices and that leave the detachment switch out of the first and second devices.

A first aspect of the present invention resides in a system including a first device and a second device connected via a cable, which includes: a connector provided on the cable and further including a first connector part being connected to the first device and a second connector part begin attachable and detachable with respect to the first connector part and being connected to the second device; and a detachment switch provided for the connector and configured to be operated when the second connector part is disconnected from the first connector part. In this configuration, at least one of the first device and the second device is configured to be triggered to perform a predetermined process when the detachment switch is operated while the second connector part remains joined to the first connector part.

A second aspect of the present invention resides in a connector for detachably connecting a first device and a second device, which includes: a first connector part being connected to the first device; a second connector part being attachable and detachable with respect to the first connector part and being connected to the second device; an engagement structure provided for the first connector part and the second connector part and configured to engage to fix connection between the first connector part and the second connector part and disengage in a direction different from the direction of disconnecting the second connector part from the first connector part; and a detachment switch configured to be turned on when the engagement structure engages and turned off when the engagement structure disengages.

According to the present invention, when the first device and the second device disengage, it is possible to prevent the operator from forgetting to operate the detachment switch. Further, since there is no need to provide a detachment switch in the first device and the second device, it is possible to prevent the configurations of the first device and the second device from becoming complex.

The above and other objects features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

Systems and connectors according to the present invention will be explained in detail hereinbelow by describing preferred embodiments with reference to the accompanying drawings.

First Embodiment

Figure 1:
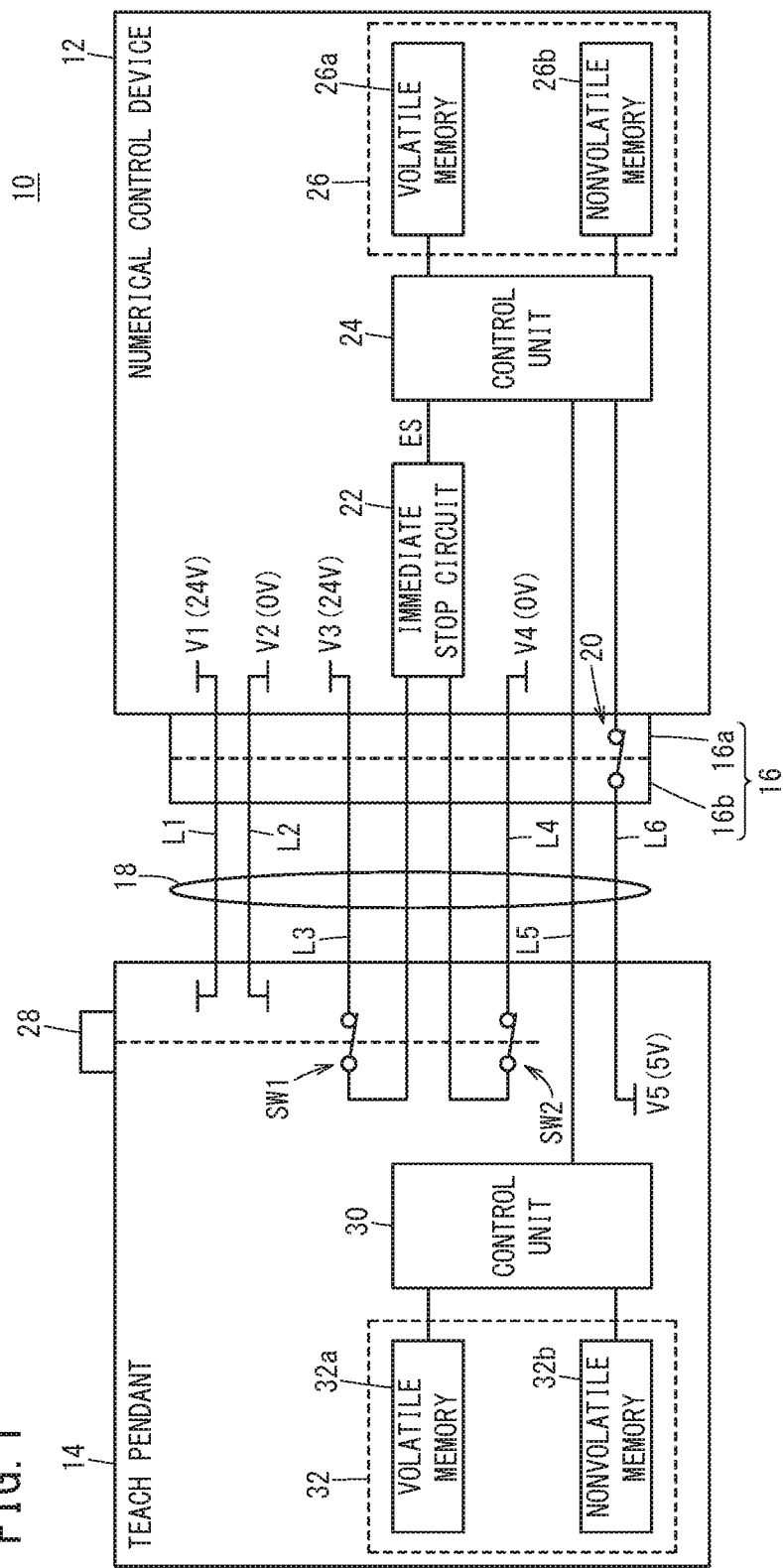
FIG. 1 is a diagram showing one example of a configuration of a system according to first and second embodiments.

FIG. 1 is a diagram showing an example of a configuration of a system 10 according to the first embodiment. The system 10 includes a first device 12, a second device 14, and a cable 18 connecting the first device 12 and the second device 14 via a connector 16. In the following description, a numerical control device for numerically controlling a robot will be described as an example of the first device 12, and a teach pendant will be described as an example of the second device 14. However, the first device 12 and the second device 14 should not be limited to these examples (numerical control device and teach pendant). The teach pendant 14 is an operation panel for operating and teaching the robot.

The connector 16 has a first connector part 16a connected to the numerical control device 12 and a second connector part 16b detachably attached to the first connector part 16a and connected to the teach pendant 14. When the second connector part 16b is connected (attached) to the first connector part 16a, the numerical control device 12 and the teach pendant 14 are connected by lead wires (wired connection). In the first embodiment, the first connector part 16a is provided for the casing of the numerical control device 12, and the second connector part 16b is connected to the cable 18 extending outwards from the casing of the teach pendant 14. The first connector part 16a may also be connected to a cable extending from the casing of the numerical control device 12.

The connector 16 is provided with a detachment switch 20 that is operated when the second connector part 16b is detached from the first connector part 16a. When connecting the first connector part 16a and the second connector part 16b, the operator closes (turns on) the detachment switch 20. When taking off the second connector part 16b from the first connector part 16a, the operator opens (turns off) the detachment switch 20 first, and then take off the second connector part 16b. Here, the detachment switch 20 may be configured so as to be automatically closed (turned on) when the first connector part 16a and the second connector part 16b are connected.

The numerical control device 12 includes an immediate stop circuit 22, a control unit 24, and a storage unit 26 having a volatile memory 26a and a nonvolatile memory 26b. The teach pendant 14 includes an immediate stop button 28, switches SW1 and SW2, a control unit 30, and a storage unit 32 having a volatile memory 32a and a nonvolatile memory 32b.

When the first connector part 16a and the second connector part 16b are connected (attached), the numerical control device 12 and the teach pendant 14 are connected by lead wires L1 to L6. At least part of these lead wires L1 to L6 forms the cable 18. The lead wire L1 supplies a voltage V1 of 24V from the numerical control device 12 to the teach pendant 14, and the lead wire L2 supplies a voltage (reference voltage) V2 of 0V from the numerical control device 12 to the teach pendant 14. As a result, a voltage of 24V is supplied from the numerical control device 12 to the teach pendant 14. The teach pendant 14 applies a voltage (for example, 5V) to each unit (for example, the control unit 30) of the teach pendant 14 using the voltage of 24V. Therefore, when disconnected from the numerical control device 12, the teach pendant 14 is shut down. It is assumed that the numerical control device 12 is supplied with electric power from an unillustrated power supply.

The switch SW1 of the teach pendant 14 is provided on the lead wire L3, which transmits a voltage V3 of 24V from the numerical control device 12 to the teach pendant 14, and the supplies the voltage to the immediate stop circuit 22 of the numerical control device 12 via the switch SW1. The switch SW2 of the teach pendant 14 is provided on the lead wire L4, which transmits a voltage (reference voltage) V4 of 0V from the numerical control device 12 to the teach pendant 14, and then, applies the voltage to the immediate stop circuit 22 of the numerical control device 12 via the switch SW2. The switches SW1 and SW2 are normally-on (normally-closed) switches which are normally closed, and are opened (turned off) in conjunction with the operation of the immediate stop button 28. That is, when the immediate stop button 28 is pressed, the switches SW1 and SW2 are opened (turned off) from the ON (closed) state. The immediate stop button 28 is a button for immediately stopping the robot.

Accordingly, when the numerical control device 12 and the teach pendant 14 are connected (when the first connector part 16a is connected to the second connector part 16b), a voltage of 24V is supplied to the immediate stop circuit 22 through the lead wires L3 and L4. When the immediate stop button 28 is operated in this state, the switches SW1 and SW2 are opened (turned off) so that no voltage is applied to the immediate stop circuit 22.

The immediate stop circuit 22 generates an immediate stop signal ES based on the input voltage and outputs it to the control unit 24. When the input voltage drops from 24V to 0V, the immediate stop circuit 22 determines that the immediate stop button 28 has been operated, and generates the immediate stop signal ES. The immediate stop circuit 22 may include a photo coupler having a light emitting element that emits light based on the input voltage and a light receiving element that receives light emitted from the light emitting element. When the voltage input to the immediate stop circuit 22 is 24V, the light emitting element emits light, and when the input voltage is 0V, the light emitting element does not emit light. Therefore, the immediate stop circuit 22, based on the electric charge received by the light receiving element, detects a falling of the input voltage and generates the immediate stop signal ES.

The lead wire L5 allows communication between the control unit 24 of the numerical control device 12 and the control unit 30 of the teach pendant 14. This configuration enables exchange of signals (data) between the control unit 24 of the numerical control device 12 and the control unit 30 of the teach pendant 14. For example, the control units 24 and 30 may exchange data with Ethernet (registered trademark).

The detachment switch 20 is provided on the lead wire L6, which applies a voltage V5 of 5V from the teach pendant 14 to the numerical control device 12 via the detachment switch 20. The teach pendant 14 steps down the voltage of 24V supplied from the numerical control device 12 through the lead lines L1 and L2 to a voltage of 5V, which is applied to the lead wire L6. When the detachment switch 20 is closed (on), the voltage V5 is supplied to the numerical control device 12, and when the detachment switch 20 is open (off), the voltage V5 is not supplied to the numerical control device 12.

Therefore, when the first connector part 16a and the second connector part 16b are connected and the detachment switch 20 is closed (on), the voltage V5 is input to the control unit 24. When the detachment switch 20 is open (off), the voltage V5 is not input to the control unit 24. Thus, the control unit 24 can recognize the opening and closing of the detachment switch 20.

Here, the state in which the voltage input to the control unit 24 through the lead wire L6 falls from 5V to 0V may be called a disconnection signal. In this case, the teach pendant 14 can be regarded as sending the disconnection signal to the control unit 24 when the detachment switch 20 is operated. Upon receiving the disconnection signal, the control unit 24 determines that the detachment switch 20 has been switched from the closed (on) state to the open (off) state, or that the first connector part 16a and the second connector part 16b are going to be disconnected. In other words, the control unit 24 can also be regarded as recognizing the opening and closing of the detachment switch 20 by monitoring the voltage input through the lead wire L6. In this case, when the voltage input through the lead wire L6 changes from 5V to 0V, the control unit 24 determines that the detachment switch 20 has been switched from the closed (on) state to the open (off) state, that is, the first connector part 16a and the second connector section 16b are going to be disconnected.

The control unit 24 is made up from a processor such as a CPU, and performs control of each part of the numerical control device 12 and the robot. The volatile memory 26a is memory for temporarily storing data, and is made up from, for example, a DRAM or the like. The volatile memory 26a functions as a buffer memory of the control unit 24. The nonvolatile memory 26b is memory for storing data, and is made up from, for example, a NAND type flash memory. The nonvolatile memory 26b stores data and the like necessary for the controlling of the control unit 24.

When the immediate stop signal ES is sent from the immediate stop circuit 22, the control unit 24 stops the robot. For example, the control unit 24 may stop the driving of the robot by cutting off the electric power supplied thereto.

The control unit 30 is made up from a processor such as a CPU and controls each part of the teach pendant 14. The volatile memory 32a is memory for temporarily storing data, and is made up from, for example, a DRAM or the like. The volatile memory 32a functions as a buffer memory of the control unit 30. The nonvolatile memory 32b is memory for storing data, and is made up from, for example, a NAND type flash memory. The nonvolatile memory 32b stores data and the like necessary for the controlling of the control unit 30.

Now, when the numerical control device 12 and the teach pendant 14 are disconnected, that is, when the second connector 16b is disconnected from the first connector part 16a, the voltage input to the immediate stop circuit 22 drops from 24V to 0V. Therefore, although the immediate stop button 28 is not operated, the immediate stop circuit 22 generates the immediate stop signal ES, so that the control unit 24 stops the robot.

Therefore, in the first embodiment, the connector 16 is provided with the detachment switch 20 that is operated when the second connector part 16b is detached from the first connector part 16a. The lead wire L6 is provided so that the numerical control device 12 and the teach pendant 14 are connected via the detachment switch 20. That is, the detachment switch 20 is provided on the lead wire L6. With this configuration, as the detachment switch 20 is operated from the closed (ON) state to the open (OFF) state by the operator when the second connector part 16b is detached from the first connector part 16a, the control unit 24, as triggered by the operation of the detachment switch 20, performs a predetermined process. Specifically, the control unit 24 performs a masking process, as the predetermined process, that masks the subsequently generated immediate stop signal ES. As a result, even when the first connector part 16a and the second connector part 16b are disconnected, it is possible to prevent the robot from stopping.

In this manner, since the detachment switch 20 is provided for the connector 16 that detachably connects the numerical control device 12 and the teach pendant 14, when the numerical control device 12 and the teach pendant 14 are disconnected, it is possible to prevent the operator from forgetting to operate the detachment switch 20. Therefore, before the numerical control device 12 and the teach pendant 14 are disconnected, the numerical control device 12 can recognize that the connection is going to be released and perform the masking process with respect to the immediate stop signal ES that is generated subsequently.

In the first embodiment, when the second connector part 16b is detached from the first connector part 16a, the detachment switch 20 needs to be reliably opened (turned off) before the disconnection of the second connector part 16b from the first connector part 16a. Now, a specific example of a configuration of the connector 16 and the detachment switch 20 will be explained in which the detachment switch 20 is surely opened (turned off) before the disconnection of the second connector part 16b from the first connector part 16a.

Figure 2A:
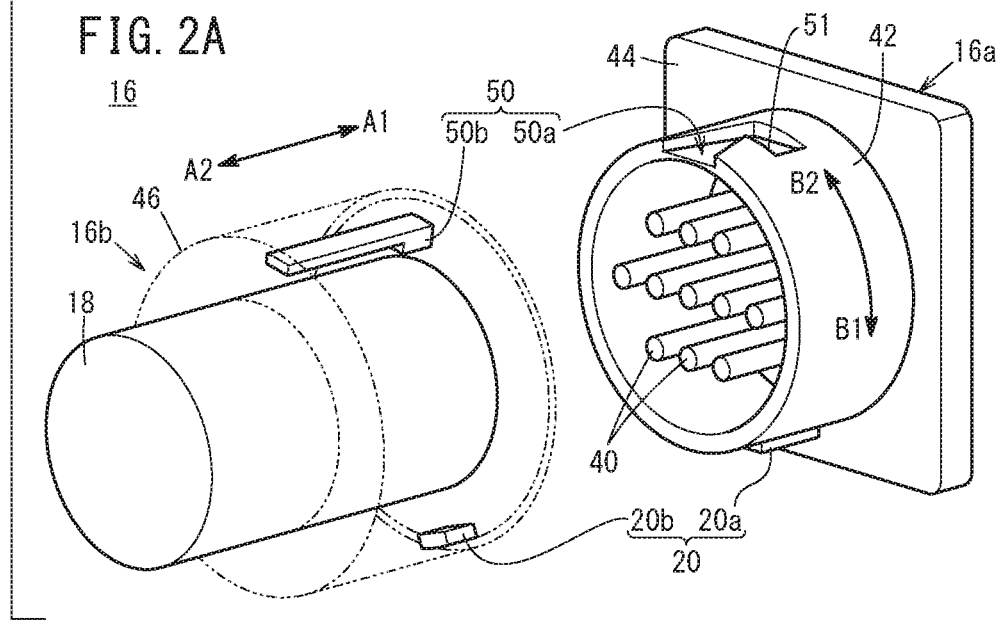
FIG. 2A is a perspective view showing a connector with a second connector part disconnected from a first connector part or with the second connector part prior to being connected to the first connector part.
Figure 2B:
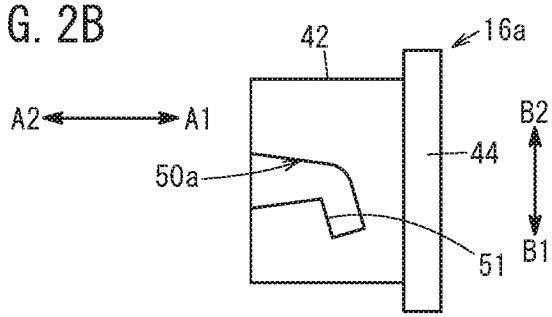
FIG. 2B is a side view of the first connector part.
Figure 2C:
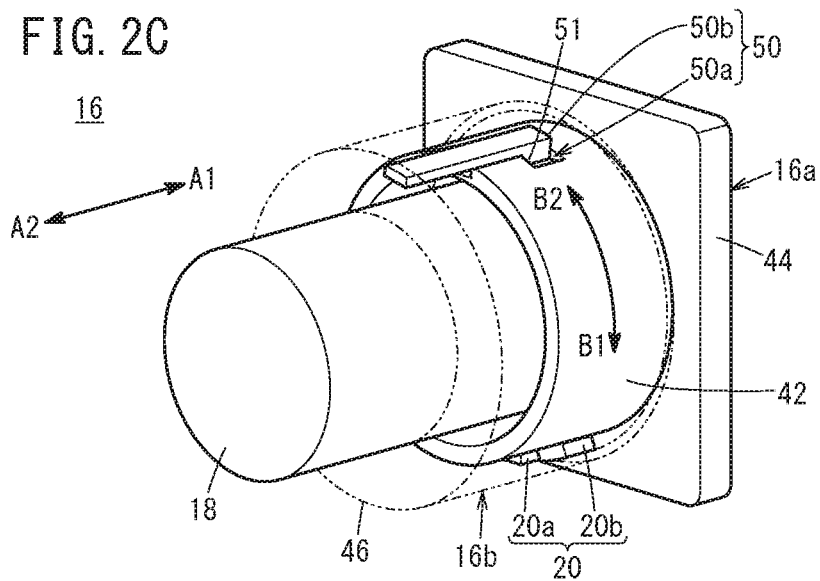
FIG. 2C is a perspective view showing the connector with the second connector part connected to the first connector part.

FIGS. 2A to 2C are views illustrating an example of a configuration of the connector 16. FIG. 2A is a perspective view showing a state of the connector 16 when the second connector part 16b is detached from the first connector part 16a or when the connector part 16b is going to be attached to the first connector part 16a. FIG. 2B is a side view of the first connector part 16a. FIG. 2C is a perspective view showing a state of the connector 16 when the second connector part 16b has been attached to the first connector part 16a.

As shown in FIG. 2A, the first connector part 16a includes a plurality of first terminals 40, a first cylinder 42 surrounding the first terminals 40 and a base portion 44 supporting the first terminals 40 and the first cylinder 42. The second connector part 16b includes a plurality of second terminals (not shown) being electrically connected to the first terminals 40 and a second cylinder 46 surrounding the second terminals. The second connector part 16b is provided at the distal end of the cable 18.

The first cylinder 42 and the second cylinder 46 are formed so as to fit into each other. The inside diameter of the second cylinder 46 is equal to or greater than the outside diameter of the first cylinder 42, and preferably equal or substantially equal thereto within a predetermined permissible range. Accordingly, the second cylinder 46 can be inserted into the first cylinder 42 and fit therein (see FIG. 2C). When the second cylinder 46 is pushed into the first cylinder 42 by a predetermined distance or more, the first terminals 40 and the second terminals are connected.

The connector 16 has an engagement structure 50 which engages to fasten the connection between the first connector part 16a and the second connector part 16b and disengages in a direction B2 which is different from the direction A2 in which the second connector 16b disengages from the first connector part 16a. The engagement structure 50 includes a slot 50a formed on the outer circumferential surface of the first cylinder 42 of the first connector part 16a and an engaging part 50b formed on the inner circumferential surface of the second cylinder 46 of the second connector part 16b. The slot 50a guides the engaging part 50b.

The slot 50a guides the engaging part 50b so that the engaging part 50b advances toward the base portion 44 in a direction A1 (in which the second connector part 16b is pushed into the first connector part 16a) and moves in an engaging (rotational) direction B1 (see FIG. 2B). The direction B1 is different from the direction A1 along which the second connector part 16b is attached to the first connector part 16a. Thus, the second connector part 16b is moved in the direction A1 and is rotated in the direction B1 so that the engaging part 50b moves along the slot 50a, whereby the engaging part 50b engages with a dead end portion 51 of the slot 50a (see FIG. 2C).

As a result, the connection between the first connector part 16a and the second connector part 16b is fixed, so that even if the second connector part 16b is pulled in the direction A2 (the direction opposite to the direction A1) in an attempt to disconnect the second connector part 16b from the first connector part 16*a*, the connector part 16*b* cannot be disconnected from the first connector part 16*a*. In other words, even if the second connector part 16*b* is simply pulled in the direction A2 in an attempt to disconnect the second connector part 16*b* from the first connector part 16*a*, the engagement structure 50 will not disengage. Therefore, in order to detach the second connector part 16*b* from the first connector part 16*a*, it is necessary to pull the second connector part 16*b* in the direction A2 while rotating the second connector part 16*b* in the direction B2 (the direction opposite to the direction B1).

In this arrangement, the detachment switch 20 is made up from a first contact 20*a* and a second contact 20*b*. The first contact 20*a* is arranged on the outer circumferential surface of the first cylinder 42 of the first connector part 16*a* while the second contact 20*b* is provided on the inner circumferential surface of the second cylinder 46 of the second connector part 16*b* (see FIGS. 2A and 2C). The first contact 20*a* and the second contact 20*b* are provided so as to contact each other when the engaging part 50*b* engages with the dead end portion 51 of the slot 50*a* (see FIG. 2C). Thus, the detachment switch 20 is turned on when the engagement structure 50 engages, and is turned off when the engagement structure 50 disengages. In other words, the detachment switch 20 is operated to be ON when the engagement structure 50 engages and is operated to be OFF when the engagement structure 50 disengages. Thereby, the detachment switch 20 can be reliably opened (turned off) before the second connector part 16*b* is detached from the first connector part 16*a*. Therefore, when releasing the connection between the numerical control device 12 and the teach pendant 14, it is possible to reliably prevent the operator from forgetting to operate the detachment switch 20.

Further, because provision of the engagement structure 50 in the detachment switch 20 makes it possible to lengthen a time period from when the engagement structure 50 disengages until the second connector part 16*b* is disconnected from the first connector part 16*a* (the connection between the first connector part 16*a* and the second connector part 16*b* is released), it is possible to secure time to perform the predetermined process.

Second Embodiment

Next, a system 10 in the second embodiment will be described. Since the configuration of the system 10 of the second embodiment is similar to the system 10 described in the first embodiment, the system 10 of the second embodiment will be described with reference to FIG. 1.

In the first embodiment, the control unit 24 is configured to perform a masking process on the immediate stop signal ES as the predetermined process. However, in the second embodiment, the control unit 24 of the numerical control device 12 is configured to read data stored in the storage unit 32 of the teach pendant 14 and write the read data to the storage unit 26, that is, perform a storing process as the predetermined process. The data to be read out from the storage unit 32 should include at least data stored in the volatile memory 32*a*. Further, the storage destination of the read data may be either the volatile memory 26*a* or the nonvolatile memory 26*b* in the storage unit 26.

As a result, even if the first connector part 16*a* and the second connector part 16*b* are disconnected and the supplying of power to the teach pendant 14 stops, data stored in the storage unit 32 of the teach pendant 14 (in particular, volatile memory 32*a*) can be protected. Therefore, when the first connector part 16*a* and the second connector part 16*b* are connected to activate the teach pendant 14, the teach pendant 14 can utilize the data protected on the numerical control device 12 side (the data stored in the storage unit 26).

Also in the second embodiment, the connector 16 and the detachment switch 20 may have similar configurations to those described in the first embodiment as shown in FIGS. 2A to 2C.

Third Embodiment

Figure 3:
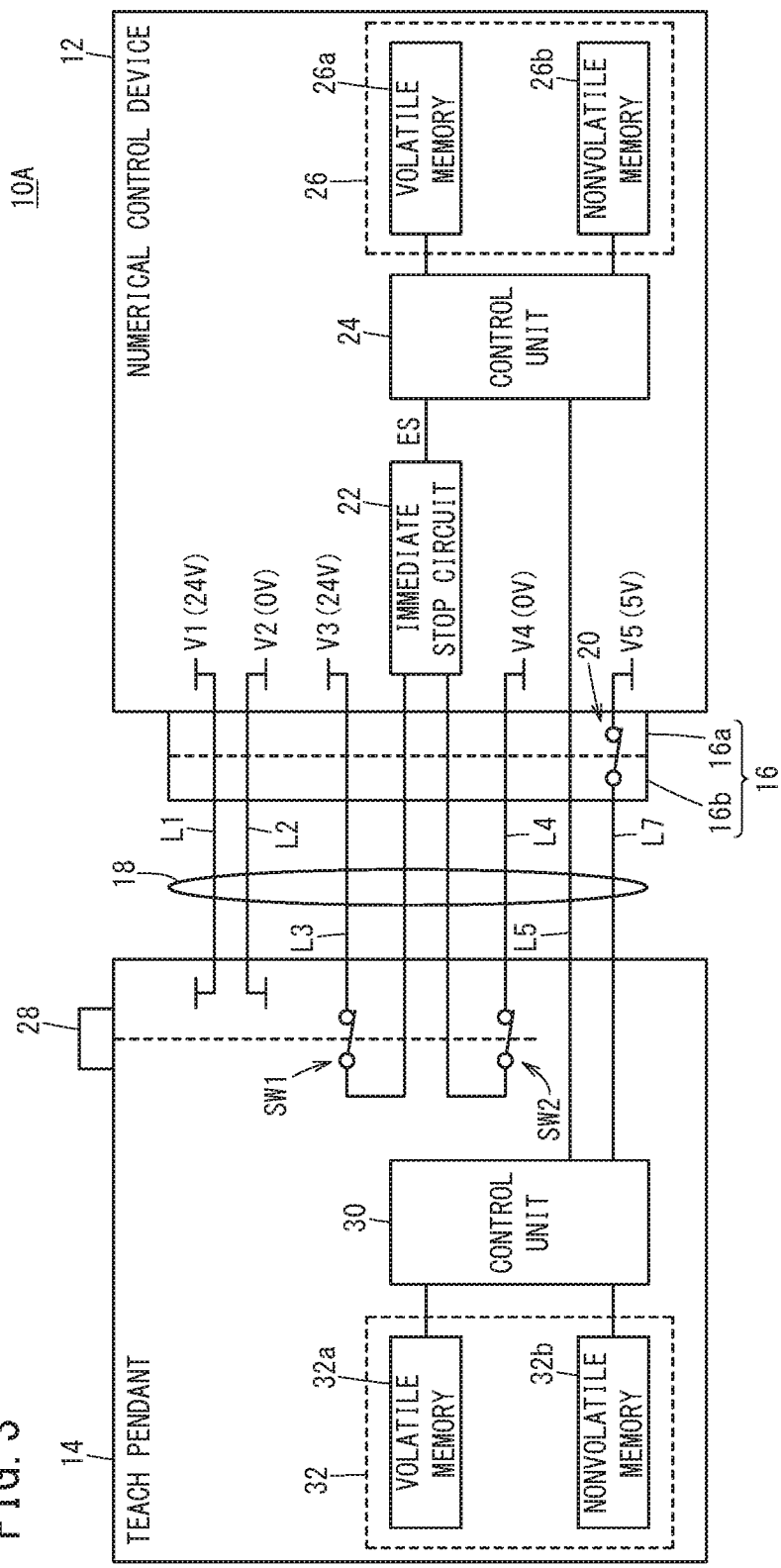
FIG. 3 is a diagram showing an example of a configuration of a system according to third and fourth embodiments.

Next, a system 10A in the third embodiment will be described. FIG. 3 is a diagram showing an example of a configuration of the system 10A according to the third embodiment. The same reference numerals are given to the same components as those described in the first embodiment, and only the different features will be described.

In the third embodiment, a lead wire L7 is provided instead of the lead wire L6, and the detachment switch 20 is provided on the lead wire L7. The lead wire L7 supplies a voltage V5 of 5V from the numerical control device 12 to the teach pendant 14 via the detachment switch 20. When the detachment switch 20 is closed (on), the voltage V5 is supplied to the teach pendant 14, and when the detachment switch 20 is open (off), the voltage V5 is not applied to the teach pendant 14.

Therefore, when the first connector part 16*a* and the second connector part 16*b* are connected and the detachment switch 20 is closed (on), the voltage V5 is input to the control unit 30. When the detachment switch 20 is open (off), the voltage V5 is not input to the control unit 30. Thus, the control unit 30 can recognize the opening and closing of the detachment switch 20.

Here, when the state in which the voltage input to the control unit 30 through the lead wire L7 falls from 5V to 0V is called a disconnection signal, the numerical control device 12 can be regarded as sending the disconnection signal to the control unit 30 when the detachment switch 20 is operated. Upon receiving the disconnection signal, the control unit 30 determines that the detachment switch 20 has been switched from the closed (on) state to the open (off) state; that is, the connection between the first connector part 16*a* and the second connector part 16*b* is going to be disconnected. In other words, the control unit 30 can also be regarded as recognizing the opening and closing of the detachment switch 20 by monitoring the voltage input through the lead wire L7. In this case, when the voltage input through the lead wire L7 changes from 5V to 0V, the control unit 30 determines that the detachment switch 20 has been switched from the closed (on) state to the open (off) state, that is, the first connector part 16*a* and the second connector section 16*b* are to be disconnected.

The control unit 30, as triggered by the operation of the detachment switch 20, performs a predetermined process. Specifically, the control unit 30 performs, as the predetermined process, a writing process (storing process) of writing data being stored in the volatile memory 32*a* into the nonvolatile memory 32*b*.

As a result, even if the first connector part 16*a* and the second connector part 16*b* is disconnected and the supplying of power to the teach pendant 14 stops, the data stored in the volatile memory 32*a* of the teach pendant 14 can be protected. Therefore, when the first connector part 16*a* and the second connector part 16*b* are connected to activate the teach pendant 14, the teach pendant 14 can use the data protected by the nonvolatile memory 32*b* (the data stored in the nonvolatile memory 32*b*).

Also in the third embodiment, the connector 16 and the detachment switch 20 may have similar configurations to those described in the first embodiment as shown in FIGS. 2A to 2C.

Fourth Embodiment

Next, a system 10A in the fourth embodiment will be described. Since the configuration of the system 10A of the fourth embodiment is similar to that of the system 10A described in the third embodiment, the system 10A of the fourth embodiment will be described with reference to FIG. 3.

In the third embodiment, the control unit 30 is configured to perform, as the predetermined process, a process of writing the data stored in the volatile memory 32a into the nonvolatile memory 32b, but in the fourth embodiment, the control unit 30 is configured to perform, as the predetermined process, a process of prohibiting the writing of the data stored in the volatile memory 32a to the nonvolatile memory 32b.

If the power to the teach pendant 14 stops during the writing process of the data stored in the volatile memory 32a into the nonvolatile memory 32b, the data stored in the nonvolatile memory 32b may be damaged. This embodiment makes it possible to prevent such an event from occurring.

Also in the fourth embodiment, the connector 16 and the detachment switch 20 may have similar configurations to those described in the first embodiment as shown in FIGS. 2A to 2C.

VARIATIONAL EXAMPLES

Each of the above-described embodiments (each of the first to fourth embodiments) may be modified as follows.

Variational Example 1

Figure 4:
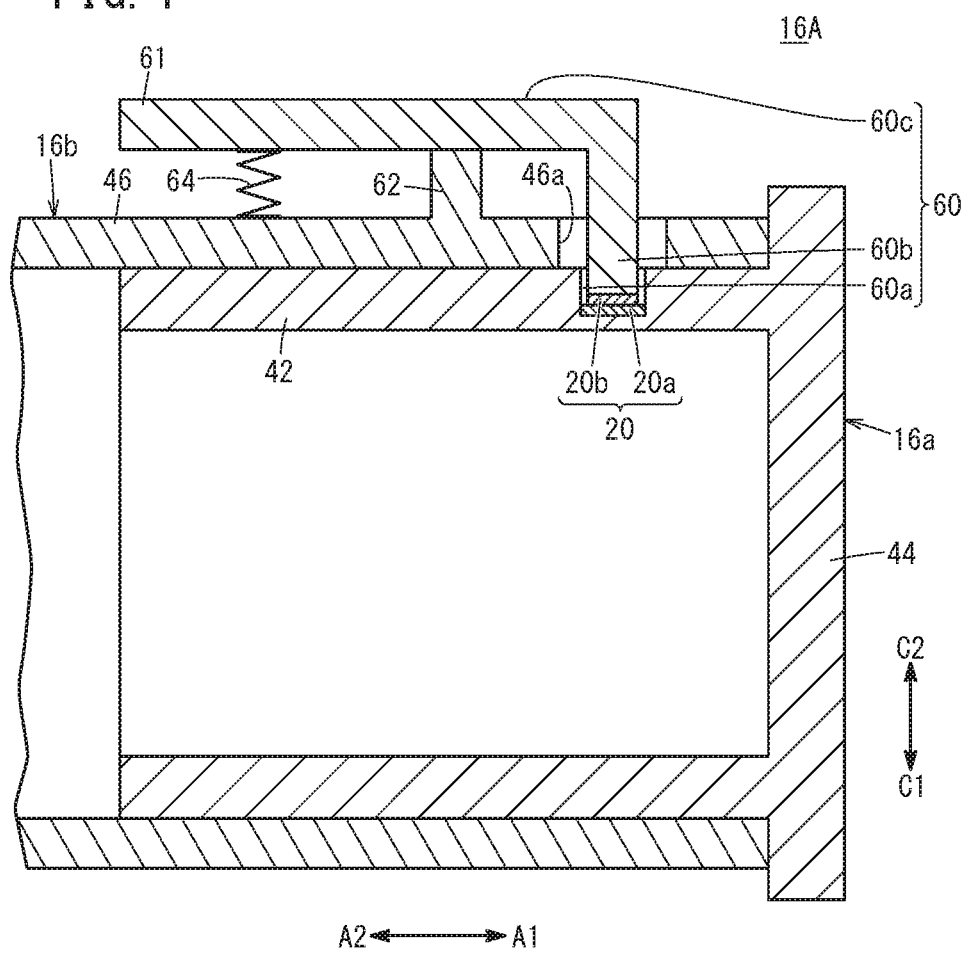
FIG. 4 is a view showing a variational example of a connector and a detachment switch.

The configuration of the connector 16 and the detachment switch 20 in which the detachment switch 20 is reliably opened (turned off) before the second connector part 16b is disconnected from the first connector part 16a is not limited to that described with reference to FIGS. 2A to 2C. FIG. 4 is a view showing a variational example of the connector 16 and the detachment switch 20. The same components as those shown in FIGS. 2A to 2C are allotted with the same reference numerals, and only the different features will be described. In FIG. 4, the cable 18, first terminals 40 of the first connector part 16a, and the second terminals of the second connector part 16b are not illustrated. The connector 16 of the variational example 1 is hereinafter referred to as 16A.

Also in the variational example 1, the connector 16A has an engagement structure 60 which engages to fasten the connection between the first connector part 16a and the second connector part 16b and disengages in a direction C2 different from the detaching direction A2 in which the first connector part 16a disengages from the second connector part 16b. The engagement structure 60 includes a recess 60a formed on the outer circumferential surface of the first cylinder 42 of the first connector part 16a, an engaging part 60b fitted (engaged) with the recess 60a, and an operational part 60c provided on the outer circumferential surface side of the second cylinder 46 of the second connector part 16b to operate the engaging part 60b.

The operational part 60c is extended parallel to the outer circumferential surface of the second cylinder 46 toward the base portion 44 of the first connector part 16a and is supported by a fulcrum 62 formed on the outer circumferential surface of the second cylinder 46. The engaging part 60b is formed at the end of the operational part 60c on the base portion 44 side so as to protrude toward the recess 60a through a through-hole 46a formed in the second cylinder 46. On the operational end 61 side which is the opposite side of the fulcrum 62 with respect to the side where the engaging part 60b of the operational part 60c is formed, a spring 64 is provided to urge the engaging part 60b toward the recess 60a (in the engaging direction C1). When the operator presses the operational end 61 of the operational part 60c toward the second cylinder 46, the operational part 60c is inclined with the fulcrum 62 working as a pivot. As a result, the engaging part 60b moves in the direction C2 so that the fitting (engagement) between the engaging part 60b and the recess 60a is released. Therefore, it is possible to disconnect the second connector part 16b from the first connector part 16a after the engagement structure 60 disengages.

In this variational example 1, the direction in which the engagement structure 60 engages is the direction C1 which is perpendicular to the directions A1 and A2 and is directed toward the outer circumferential surface of the first cylinder 42. The direction in which the engagement structure 60 is disengaged is the direction C2 which is perpendicular to the directions A1 and A2 and is directed away from the outer circumferential surface of the first cylinder 42, being the opposite direction of C1. Therefore, the direction C1 is different from the direction A1, and the direction C2 is different from the direction A2. Therefore, even if the second connector part 16b is pulled in the direction A2 to detach the second connector part 16b from the first connector part 16a, the engagement structure 60 cannot disengage.

The first contact 20a of the detachment switch 20 is provided on the bottom surface of the recess 60a while the second contact 20b is provided at the distal end of the engaging part 60b on the first cylinder 42 side. Therefore, the first contact 20a and the second contact 20b contact each other when the engaging part 60b engages with the recess 60a. As a result, the detachment switch 20 is turned on when the engagement structure 60 engages and is turned off when the engagement structure 60 disengages. That is, the detachment switch 20 becomes ON when the engagement structure 60 engages and becomes OFF when the engagement structure 60 disengages. Thereby, the detachment switch 20 can be reliably opened (turned off) before the second connector part 16b is detached from the first connector part 16a. Here, in the case of the configuration shown in FIG. 4, the detachment switch 20 is automatically turned on when the second connector part 16b is attached to the first connector part 16a.

Further, provision of the engagement structure 60 in the detachment switch 20 makes it possible to lengthen a time period from when the engagement structure 60 disengages until the second connector part 16b is disconnected from the first connector part 16a (the connection between the first connector part 16a and the second connector part 16b is released), so that it is possible to secure time for performing the predetermined process.

Variational Example 2

In each of the above-described embodiments and variational example 1, the detachment switch 20 is ON when the engagement structure 50 or 60 engages, and is OFF when the engagement structure 50 or 60 disengages. However, the switch may be configured to be OFF when the engagement structure 50 or 60 engages and is ON when the engagement structure 50 or 60 disengages. In this case, at least one of the control unit 24 of the numerical control device 12 and the control unit 30 of the teach pendant 14 may perform the predetermined process, triggered by an event that the detachment switch 20 is turned on.

Thus, according to the first to fourth embodiments and variational examples described heretofore, a system (10, 10A) including a first device (12) and a second device (14) connected via a cable (18), includes: a connector (16, 16A) provided on the cable (18) and including a first connector part (16*a*) being connected to the first device (12) and a second connector part (16*b*) being attachable and detachable with respect to the first connector part (16*a*) and being connected to the second device (14); and a detachment switch (20) provided for the connector (16, 16A) and configured to be operated when the second connector part (16*b*) is disconnected from the first connector part (16*a*). At least one of the first device (12) and the second device (14) is configured to be triggered to perform a predetermined process when the detachment switch (20) is operated while the second connector part (16*b*) remains joined to the first connector part.

In this way, since the detachment switch (20) is provided for the connector (16, 16*a*) that connects and disconnects the first device (12) and the second device (14), it is possible to prevent the operator from forgetting to operate the detachment switch (20) when the first device (12) and the second device (14) are disconnected. Therefore, at least one of the first device (12) and the second device (14) can recognize that the connection is going to be broken before the first device (12) and the second device (14) are disconnected, and perform a predetermined process. Further, since there is no need to provide the detachment switch (20) in the first device (12) or the second device (14), it is possible to prevent the configurations of the first device (12) and the second device (14) from becoming complex.

The connector (16, 16A) may include an engagement structure (50, 60) configured to engage to fix connection between the first connector part (16*a*) and the second connector part (16*b*) and disengages in a direction different from the direction of disconnecting the second connector part (16*b*) from the first connector part (16*a*). The detachment switch (20) is operated, following the disengagement of the engagement structure (50, 60). This configuration enables the operator to operate the detachment switch (20) before the second connector part (16*b*) is disconnected from the first connector part (16*a*). Therefore, when the first device (12) and the second device (14) are disconnected, it is possible to reliably prevent the operator from forgetting to operate the detachment switch (20).

The second connector part (16*b*) may be configured to become able to be disconnected from the first connector part (16*a*) after the disengagement of the engagement structure (50, 60). As a result, the operator can always operate the detachment switch (20) before the second connector part (16*b*) is disconnected from the first connector part (16*a*).

The second device (14) may include an immediate stop button (28). The first device (12) may be configured to generate an immediate stop signal (ES) to stop a robot when the immediate stop button (28) is operated and when the first device (12) and the second device (14) are disconnected. The first device (12) may be configured to perform a masking process on the immediate stop signal (ES) as the predetermined process. Thereby, it is possible to prevent the robot from stopping when the first device (12) and the second device (14) are disconnected.

The second device (14) and the first device (12) include storage units (32, 26) for storing data, respectively. The first device (12) may be configured to perform, as the predetermined process, a process of writing the data stored in the storage unit (32) of the second device (14) into the storage unit (26) of the first device. Thereby, even when the first connector part (16*a*) and the second connector part (16*b*) are disconnected and the supplying of power to the second device (14) stops, it is possible to protect the data stored in the storage unit (32) of the second device (14). Therefore, when the first connector part (16*a*) and the second connector part (16*b*) are connected to activate the second device (14), the second device (14) can use the data protected in the storage unit (26) of the first device (12).

The second device (14) may be configured to transmit to the first device (12) a disconnection signal indicating that the first device (12) and the second device (14) are going to be disconnected, when the detachment switch (20) is operated while the second connector part (16*b*) remains joined to the first connector part (16*a*). The first device (12) may be configured to be triggered by reception of the disconnection signal to perform the predetermined process. In this way, the first device (12) can recognize that the first device (12) and the second device (14) are going to be disconnected.

The second device (14) includes a processor (30), a storage unit (32) having a volatile memory (32*a*) functioning as a buffer memory for the processor (30), and a nonvolatile memory (32*b*) storing data. The second device (14) may be configured to perform a process of writing the data stored in the volatile memory (32*a*) into the nonvolatile memory (32*b*), as the predetermined process. Thereby, even when the first connector part (16*a*) and the second connector part (16*b*) are disconnected so that the supplying of power to the second device (14) stops, it is possible to protect the data stored in the volatile memory (32*a*) of the second device (14). Therefore, when the first connector part (16*a*) and the second connector part (16*b*) are connected to activate the second device (14), the second device (14) can use the data protected in nonvolatile memory (32*b*).

Alternatively, the second device (14) may be configured to perform a process of prohibiting the data stored in the volatile memory (32*a*) from being written into the nonvolatile memory (32*b*), as the predetermined process. Thereby, when the first connector part (16*a*) and the second connector part (16*b*) are disconnected and the supplying of power to the second device (14) stops, it is possible to prevent the data stored in the nonvolatile memory (32*b*) from being damaged.

The first device (12) may be configured to transmit to the second device (14) a disconnection signal indicating that the first device (12) and the second device (14) are going to be disconnected when the detachment switch (20) is operated with the second connector part (16*b*) joined to the first connector part (16*a*). The second device (14) may be configured to be triggered by reception of the disconnection signal to perform the predetermined process. In this way, the second device (14) can recognize that the first device (12) and the second device (14) are going to be disconnected.

A connector (16, 16A) for detachably connecting a first device (12) and a second device (14), includes: a first connector part (16*a*) being connected to the first device (12); a second connector part (16*b*) being attachable and detachable with respect to the first connector part (16*a*) and being connected to the second device (14); an engagement structure (50, 60) provided for the first connector part (16*a*) and the second connector part (16b) and configured to engage to fix connection between the first connector part (16a) and the second connector part (16b) and disengage in a direction different from the direction of disconnecting the second connector part (16b) from the first connector part (16a); and a detachment switch (20) configured to be turned on when the engagement structure (50, 60) engages and is turned off when the engagement structure disengages.

As a result, the operator can operate the detachment switch (20) before the second connector part (16b) is disconnected from the first connector part (16a). Therefore, it is possible to reliably prevent the operator from forgetting to operate the detachment switch (20) when the first device (12) and the second device (14) are disconnected. Therefore, at least one of the first device (12) and the second device (14) can recognize that the connection is going to be broken before the first device (12) and the second device (14) are disconnected, hence perform a predetermined process. Further, since there is no need to provide the detachment switch (20) in the first device (12) or the second device (14), it is possible to prevent the configurations of the first device (12) and the second device (14) from becoming complex.

The first device (12) may be a numerical control device for a robot. The second device (14) may be a control panel.

The first device (12) may be a numerical control device for a robot. The second device (14) may be a control panel.

Although the present invention has been described with reference to the embodiments, the technical scope of the present invention should not be limited to the scope described in the above embodiment. It goes without saying that various modifications and/or improvements can be added to the above embodiment. It is obvious from the description of the scope of the claims that modes with such modifications and/or improvements can be included in the technical scope of the present invention.

What is claimed is:

1. A system including a first device and a second device connected via a cable, comprising:
    a connector provided on the cable and including
        a first connector part being connected to the first device and
        a second connector part being attachable and detachable with respect to the first connector part and being connected to the second device; and
    a detachment switch provided for the connector and configured to be operated when the second connector part is disconnected from the first connector part,
    wherein at least one of the first device and the second device is configured to be triggered to perform a predetermined process when the detachment switch is operated while the second connector part remains joined to the first connector part.

2. The system according to claim 1, wherein:
    the connector includes an engagement structure configured to engage to fix connection between the first connector part and the second connector part and disengage in a direction different from a direction of disconnecting the second connector part from the first connector part; and
    the detachment switch is operated, following the disengagement of the engagement structure.

3. The system according to claim 2, wherein the second connector part is configured to become able to be detached from the first connector part after the disengagement of the engagement structure.

4. The system according to claim 1, wherein:
    the second device comprises an immediate stop button; and
    the first device is configured to generate an immediate stop signal to stop a robot when the immediate stop button is operated and when the connection between the first device and the second device is released, and perform a masking process on the immediate stop signal as the predetermined process.

5. The system according to claim 1, wherein:
    the second device and the first device include storage units that store data, respectively; and
    the first device is configured to perform, as the predetermined process, a process of writing the data stored in the storage unit of the second device into the storage unit of the first device.

6. The system according to claim 4, wherein:
    the second device is configured to transmit to the first device a disconnection signal indicating that the first device and the second device are going to be disconnected, when the detachment switch is operated while the second connector part remains joined to the first connector part; and
    the first device is configured to be triggered by reception of the disconnection signal to perform the predetermined process.

7. The system according to claim 5, wherein:
    the second device is configured to transmit to the first device a disconnection signal indicating that the first device and the second device are going to be disconnected, when the detachment switch is operated while the second connector part remains joined to the first connector part; and
    the first device is configured to be triggered by reception of the disconnection signal to perform the predetermined process.

8. The system according to claim 1, wherein:
    the second device comprises a processor, a storage unit having a volatile memory functioning as a buffer memory for the processor, and a nonvolatile memory storing data; and
    the second device is configured to perform, as the predetermined process, a process of writing the data stored in the volatile memory into the nonvolatile memory.

9. The system according to claim 1, wherein:
    the second device comprises a processor, a storage unit having a volatile memory functioning as a buffer memory for the processor, and a nonvolatile memory storing data; and
    the second device is configured to perform, as the predetermined process, a process of prohibiting the data stored in the volatile memory from being written into the nonvolatile memory.

10. The system according to claim 7, wherein:
    the first device is configured to transmit to the second device a disconnection signal indicating that the first device and the second device is going to be disconnected, when the detachment switch is operated while the second connector part remains joined to the first connector part; and
    the second device is configured to be triggered by reception of the disconnection signal to perform the predetermined process.

11. The system according to claim 8, wherein:
    the first device is configured to transmit to the second device a disconnection signal indicating that the first device and the second device is going to be disconnected, when the detachment switch is operated while the second connector part remains joined to the first connector part; and the second device is configured to be triggered by reception of the disconnection signal to perform the predetermined process.

12. The system according to claim 1, wherein the first device is a numerical control device for a robot, and the second device is a control panel.

13. A connector for detachably connecting a first device and a second device, comprising:

a first connector part being connected to the first device;

a second connector part being attachable and detachable with respect to the first connector part and being connected to the second device;

an engagement structure provided for the first connector part and the second connector part and configured to engage to fix connection between the first connector part and the second connector part and disengages in a direction different from a direction of disconnecting the second connector part from the first connector part; and a detachment switch configured to be turned on when the engagement structure engages and turned off when the engagement structure disengages.

14. The connector according to claim 13, wherein the first device is a numerical control device for a robot, and the second device is a control panel.

* * * * *